US006841456B2

(12) United States Patent
Hersee et al.

(10) Patent No.: US 6,841,456 B2
(45) Date of Patent: Jan. 11, 2005

(54) METHOD OF MAKING AN ICOSAHEDRAL BORIDE STRUCTURE

(76) Inventors: Stephen D. Hersee, 3712 Silver Ave. SE., Albuquerque, NM (US) 87108; Ronghua Wang, 939 Buena Vista Dr., SE., Apt. F203, Albuquerque, NM (US) 87106; David Zubia, 4409 Buckingham Dr., El Paso, TX (US) 79902; Terrance L. Aselage, 62 Avenida Del Sol, Cedar Crest, NM (US) 87008; David Emin, 1502 Harvard Ct. NE., Albuquerque, NM (US) 87106

( * ) Notice: Subject to any disclaimer, the term of this patent is extended or adjusted under 35 U.S.C. 154(b) by 0 days.

(21) Appl. No.: 10/418,018

(22) Filed: Apr. 17, 2003

(65) Prior Publication Data

US 2004/0005768 A1 Jan. 8, 2004

Related U.S. Application Data

(63) Continuation of application No. 10/277,262, filed on Oct. 22, 2002, which is a continuation-in-part of application No. 09/832,278, filed on Apr. 9, 2001, now Pat. No. 6,479,919.

(60) Provisional application No. 60/356,926, filed on Oct. 26, 2001.

(51) Int. Cl.[7] ........................ H01L 21/20; H01L 21/36; C30B 1/00

(52) U.S. Cl. ....................... 438/478; 438/507; 438/584; 438/931

(58) Field of Search ................................ 438/478, 507, 438/584, 931, 953

(56) References Cited

U.S. PATENT DOCUMENTS 3,506,869 A 4/1970 Burmeister et al. ......... 313/108

OTHER PUBLICATIONS

Kumashiro, Y.; Yokoyama, T.; and Ando, Y. "Thermoelectric Properties of Boron and Boron Phosphide CVD Wafers." Proceedings ICT 98. XVII International Conference on Thermoelectrics, 1998, pp. 591–594.*

M. Takigawa, et al. "Hetero–Epitaxial Growth of Lower Boron Phosphide on Silicon Substrate Using $Ph_3$–$B_2H_6$–$H_2$ System" Japanese Journal of Applied Physics, vol. 12, No. 10, Oct. 1973, pp. 15041509.

M. Hirayama, et al., "Hetero–Epitaxial Growth of Lower Boron Arsenide on Si Substrate Using $Ash_3$–$B_2H_6$–$H_2$ System", Japanese Journal of Applied Physics, vol. 12, No. 12, 1973, pp. 1960–1961.

(List continued on next page.)

*Primary Examiner*—Anh Phung
*Assistant Examiner*—Beth E. Owens
(74) *Attorney, Agent, or Firm*—Patent Law Office of David G. Beck

(57) ABSTRACT

A method for fabricating thin films of an icosahedral boride on a silicon carbide (SiC) substrate is provided. Preferably the icosahedral boride layer is comprised of either boron phosphide ($B_{12}P_2$) or boron arsenide ($B_{12}As_2$). The provided method achieves improved film crystallinity and lowered impurity concentrations. In one aspect, an epitaxially grown layer of $B_{12}P_2$ with a base layer or substrate of SiC is provided. In another aspect, an epitaxially grown layer of $B_{12}As_2$ with a base layer or substrate of SiC is provided. In yet another aspect, thin films of $B_{12}P_2$ or $B_{12}As_2$ are formed on SiC using CVD or other vapor deposition means. If CVD techniques are employed, preferably the deposition temperature is above 1050° C., more preferably in the range of 1100° C. to 1400° C., and still more preferably approximately 1150° C.

20 Claims, 5 Drawing Sheets

OTHER PUBLICATIONS

Y. Kumashiro, et al. "Epitaxial Growth of Rhombohedral Boron Phosphide Single Crystalline Films by Chemical Vapor Deposition", Journal of Solid State Chemistry, 133, 104–112 (1997), Article No. SC977324.

R.A. Burmeister, Jr., et al. "Synthesis and Crystal Growth of $B_6P$", Transactions of the Metallurgical Society of AIME, vol. 239, Mar. 1967, pp. 408–413.

M. Carrard, et al., "Defect Clustering and Self–healing of Electron–irradiated Boron–rich Solids", The American Physical Society, Physical Review B, vol. 51, No. 17, May, 1995, pp. 11270–11274.

L.A.Correia, et al., "Chemical Vapour Deposition of Boron Subarsenide Using Halide Reactants", Elsevier Science Publishers B.V., Reactivity of Solids, 2 (1986) 203–213.

D. Emin, et al. "Novel Energy Conversion Devices of Icosahedral Borides", "Icosahedral Borides are Distinctive Solids", "The Unusual Properties of these Borides Offer the Promise of their Serving as the Basis of Novel Energy Conversion Devices", presentation at Energy Harvesting Program Review, Apr. 13–14, 2000.

F.V. Williams, et al. "The Preparation and Properties of Boron Phosphides and Arsenides", J. Am. Chem. Soc. vol. 82, 1960, pp. 1330–1332.

T.L. Chu, et al. "Crystals and Epitaxial Layers of Boron Phosphide", Journal of Applied Physics, vol. 42, No. 1, Jan. 1971, pp. 420–424.

M. Hirayama, et al. "Hetero–Epitaxial Growth of Lower Boron Arsenide on Si Substrate Using $AsH_3$–$B_2H_6$–$H_2$ System", Japan J. Appl. Phys., vol. 12 (1973) No. 12, pp. 1960–1961.

T.L. Chu, et al., "Preparation and Properties of Boron Arsenide Films", J.Electrochem Soc.: Solid–State Science and Technology, vol. 121, No. 3, Mar. 1974, pp. 412–415.

V.E. Amberger, et al., "Struktur des borreichen Borphosphids", Acta Cryst. (1974), B30, 2549–2553.

T. Takenaka, et al. "Double–Layer Epitaxial Growth of Si and $B_{13}P_2$ on Si Substrates and Some Electrical Properties of Si Layers", Japanese Journal of Applied Physics, vol. 13, No. 8, Aug. 1974, pp. 1211–1215.

J.A. Perri, et al., "New Group III–group V Compounds: BP and BAs", Acta Cryst. (1958), 11, 310.

* cited by examiner

METHOD OF MAKING AN ICOSAHEDRAL BORIDE STRUCTURE

CROSS-REFERENCES TO RELATED APPLICATIONS

This application is a continuation of U.S. patent application Ser. No. 10/277,262, filed Oct. 22, 2002, which is a continuation-in-part of U.S. patent application Ser. No. 09/832,278, filed Apr. 9, 2001 now U.S. Pat. No. 6,479,919, which claims the benefit of U.S. Provisional Patent Application Ser. No. 60/356,926, filed Oct. 26, 2001, the specifications of which are incorporated herein in their entirety for any and all purposes.

GOVERNMENT RIGHTS

This invention was made with Government support under Contract No. DE-AC04-94AL85000 awarded by the United States Department of Energy. The Government has certain rights in the invention.

BACKGROUND OF THE INVENTION

The icosahedral borides, such as boron phosphide ($B_{12}P_2$) and boron arsenide ($B_{12}As_2$), are hard and chemically inert solids that exhibit exceptional radiation tolerance due, at least in part, to the strong bonding within the boron icosahedra. It has been suggested that if these wide bandgap materials could be suitably doped, they would be useful for a variety of applications, in particular those applications requiring radiation hardness and/or high temperature capabilities. Early work has indicated that a high background impurity concentration will degrade the luminescence properties of $B_{12}P_2$ while crystalline imperfections are expected to degrade the electrical transport properties of the material. It is expected that $B_{12}As_2$ and $B_{12}P_2$ will exhibit similar electrical and optical behavior because of the structural similarity of these two materials.

Crystalline perfection and background impurity issues are linked as crystalline imperfections cause increased contamination incorporation through accelerated diffusion. Additionally, crystalline imperfections provide natural locations for accommodating such contaminants. Therefore it is anticipated that the intrinsic electrical, optical and other properties of $B_{12}P_2$ and $B_{12}As_2$ will best be revealed in high crystalline quality samples that have a low background impurity concentration.

In order to obtain the desired icosahedral boride material, a number of parties have produced $B_{12}P_2$ and $B_{12}As_2$ thin films using chemical vapor deposition (CVD) techniques. For example, in 1973 Hirayama et al. published a note entitled "Hetero-Epitaxial Growth of Lower Boron Arsenide on Si Substrate Using $Ph_3$—$B_2H_6$—$H_2$ System" (Jap. J. Appl. Phys., 12 (1973)1504–1509) in which it was shown that $B_{12}As_2$ could be deposited using dilute hydride sources of diborane ($B_2H_6$) and arsine ($AsH_3$) in a hydrogen ambient environment. The $B_{12}As_2$ films were deposited on silicon substrates with three different orientations, (100), (110) and (111). The film morphology was found to be orientation dependent. Electron reflection diffraction analysis indicated that the films were single crystal, epitaxial $B_{12}As_2$ thin films containing patches of polycrystalline material.

Years later, in an article entitled "Chemical Vapor Deposition of Boron Subarsenide Using Halide Reactants" (Reactivity of Solids, 2 (1986)203–213), Correia et al. demonstrated that $B_{12}As_2$ films could be grown by CVD on a variety of substrates (i.e., tungsten, nickel, fused quartz, Si(111) and Si(100)) using the halide sources $BBr_3$ and $AsCl_3$. The authors established that the film crystallinity was dependent on growth conditions, especially growth temperature and source flow rate, and showed how changing these conditions could yield either amorphous films or polycrystalline films. They also found that during deposition on a silicon substrate, intermixing occurred between the $B_{12}As_2$ and silicon, with up to 4% Si being found in the $B_{12}As_2$ film.

In 1997 Kumashiro et al. published an article entitled "Epitaxial Growth of Rhombohedral Boron Phosphide Single Crystalline Films by Chemical Vapor Deposition" (J. Solid State Chem., 133 (1997)104–112) reporting the results of $B_{12}P_2$ film growth on silicon using CVD techniques. The authors confirmed the sensitivity of film crystallinity in $B_{12}P_2$ to the growth conditions and found that polycrystalline $B_{12}P_2$ was obtained at a growth temperature of 1050° C. while single crystal $B_{12}P_2$ was obtained at a temperature of 1100° C. They also confirmed earlier findings that reactant gas flow is the most important parameter in determining the quality of the grown crystal.

Although it appears that the growth conditions for $B_{12}As_2$ and $B_{12}P_2$ have been optimized, the desired film crystallinity and impurity concentrations have not yet been achieved. Accordingly, what is needed in the art is a method for achieving the desired film crystallinity and impurity concentrations in icosahedral boride materials. The present invention provides such a method and the desired resultant material.

SUMMARY OF THE INVENTION

The present invention provides a method for fabricating thin films of crystalline icosahedral boride on a silicon carbide (SiC) substrate. Preferably the crystalline icosahedral boride layer is comprised of either boron phosphide ($B_{12}P_2$) or boron arsenide ($B_{12}As_2$). The method provides improved film crystallinity and lowered impurity concentrations.

In one aspect of the invention, an epitaxially grown layer of $B_{12}P_2$ which is in crystallographic registry with a base layer or substrate of SiC is provided.

In another aspect of the invention, an epitaxially grown layer of $B_{12}As_2$ which is in crystallographic registry with a base layer or substrate of SiC is provided.

In yet another aspect of the invention, thin films of $B_{12}P_2$ or $B_{12}As_2$ are formed on SiC using CVD or other vapor deposition means. If CVD techniques are employed, preferably the deposition temperature is above 1050° C., more preferably in the range of 1100° C. to 1400° C., and still more preferably approximately 1150° C.

A further understanding of the nature and advantages of the present invention may be realized by reference to the remaining portions of the specification and the drawings.

DESCRIPTION OF THE SPECIFIC EMBODIMENTS

Silicon carbide (SiC) offers a variety of characteristics that make it an ideal candidate for a base substrate for the epitaxial growth of icosahedral boride layers in general, and boron arsenide ($B_{12}AS_2$) and boron phosphide ($B_{12}P_2$) layers in particular. First and foremost is the lattice parameter of SiC, which closely matches that of $B_{12}As_2$ and $B_{12}P_2$. By matching lattice parameters, epitaxial film strain and the associated strain energy can be minimized.

If the epitaxial film strain associated with mismatched lattice parameters is maintained to a level below approximately 2 percent, typically a thin film can be grown as a uniform 2-dimensional layer. As the film thickness increases, however, the strain energy also increases, eventually being large enough to create misfit dislocations. If the lattice mismatch strain is larger than approximately 2 percent, the deposited material may rearrange itself from a uniform 2-dimensional film to form an array of 3-dimensional islands. Depending upon the actual strain value, formation of 3-dimensional islands can occur at the start of deposition or after some thickness of 2-dimensional film growth has occurred. When 3-dimensional growth occurs, the resultant film will typically be polycrystalline and have a rough surface morphology.

As a result of the close match in lattice parameters between two unit cells of SiC and one unit cell of $B_{12}As_2$, and to a lesser degree $B_{12}P_2$, lattice mismatch strain is minimized. Accordingly, films of $B_{12}As_2$ and $B_{12}P_2$ can be grown on SiC which exhibit improved crystallinity and surface morphology.

In addition to favorable lattice parameters, SiC offers both high thermal and chemical stability. As a consequence of these material characteristics, SiC is suitable for use in a high temperature, or otherwise aggressive, deposition environment. Accordingly, icosahedral boride layers exhibiting negligible contamination can be exitaxially grown on SiC substrates.

Figure 1:
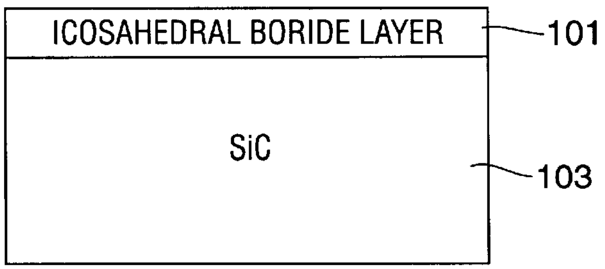
FIG. 1 is an illustration of a structure in accordance with the present invention.

As illustrated in FIG. 1, and in accordance with the invention, a thin film 101 of the desired icosahedral boride material (e.g., $B_{12}As_2$ or $B_{12}P_2$) is deposited onto a base substrate 103 comprised of SiC. Due to the close match of the lattice parameter of substrate 103 with layer 101, negligible lattice mismatch strain occurs. As a result, a uniform 2-dimensional film is formed.

As previously noted, to achieve a high quality film, it is desirable to match as close as possible the lattice parameter of the substrate to that of the deposited film. For $B_{12}As_2$ and $B_{12}P_2$ thin films, the lattice parameters are extremely close to that of twice the unit cell of SiC. For example, the basal-plane, lattice parameter of $B_{12}As_2$ ($a_{B_{12}As_2}$=6.145 Å) is approximately (to within <0.14%) equal to twice the basal plane lattice parameter of SiC ($a_{SiC}$=3.077 Å). As a result of this lattice match-up, it is possible to epitaxially deposit a layer of $B_{12}As_2$ onto a SiC substrate. Although the lattice match-up between $B_{12}P_2$ and SiC is not as good as that between $B_{12}As_2$ and SiC (approximately 2.8% versus less than 0.14%), the lattice parameters are still close enough to generally allow epitaxial growth of $B_{12}P_2$ layers.

Figure 2:
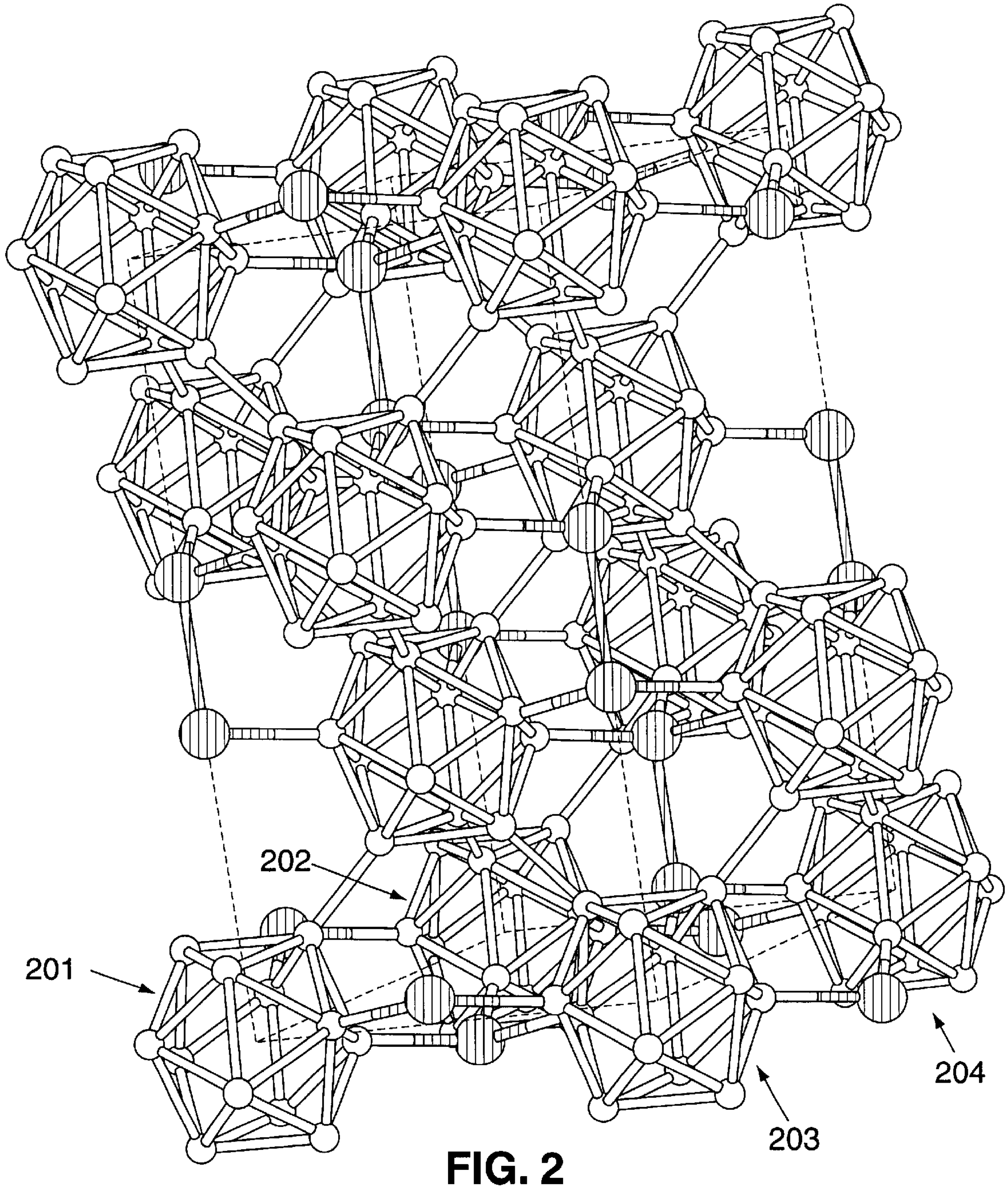
FIG. 2 is an illustration of the complex unit cell of $B_{12}As_2$.
Figure 3:
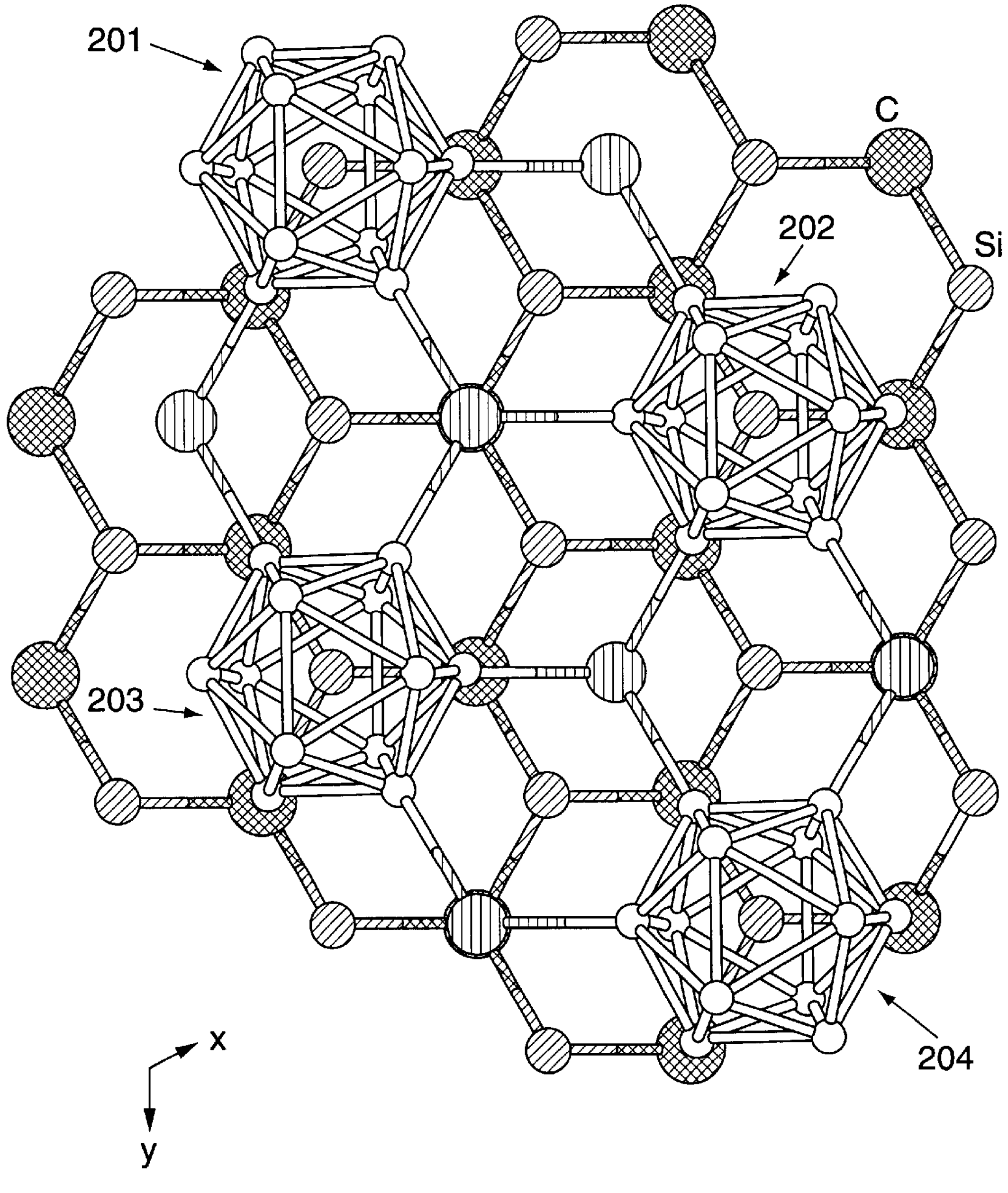
FIG. 3 is a scale drawing of four boron icosahedra overlaying a SiC basal plane atomic structure.

FIGS. 2 and 3 illustrate the epitaxial relationship between $B_{12}As_2$ and SiC. FIG. 2 shows the complex unit cell of $B_{12}As_2$, illustrating the 12-atom, boron icosahedra with four of the boron icosahedra at the base of the unit cell numbered 201–204. FIG. 3 is a scale drawing showing boron icosahedra 201–204 overlaying the SiC basal plane atomic structure. Boron icosahedra 201–204 are shown in FIG. 3 in their normal, unstrained relative positions. For clarity, only the four icosahedra and one monolayer of SiC are shown. The excellent lattice match between the two crystal structures is readily apparent in this figure.

Although it is expected that a variety of different substrate orientations can be used without severely affecting the resultant film quality, substrate misorientation is preferably not much more than 3.5 degrees off of <0001>, more preferably less than 3.5 degrees off of <0001>, and still more preferably oriented along <0001>.

In the preferred embodiment, the desired icosahedral boride films are grown on the SiC base substrate using chemical vapor deposition (CVD). It will be appreciated, however, that other epitaxial growth techniques are equally applicable to the present invention (e.g., molecular beam epitaxy or MBE).

EXAMPLES $B_{12}As_2$ films were deposited on 6H <0001>and 3.5° off <0001>6H—SiC substrates in an RF-heated, horizontal-geometry CVD reactor. The SiC substrates were approximately 300 μm thick and were n-type with a bulk resistivity of approximately 0.1 Ω-cm. The substrates were degreased and then dried under nitrogen gas before being loaded into the CVD reactor. CVD films were grown using dilute sources of diborane (1% $B_2H_6$ in $H_2$) and arsine (1% $AsH_3$ in $H_2$), which provided boron and arsenic respectively. The flow rates for each of the source gases was 50 sccm with a hydrogen carrier gas flow rate of 5 slm. In order to obtain crystalline films, the deposition temperature should be above 1050° C., preferably in the range of 1100° C. to 1400° C., and more preferably approximately 1150° C. At a deposition temperature of 1150° C. and a pressure of 100 torr, a $B_{12}As_2$ growth rate of 0.2 μm/hr was achieved.

Figure 4:
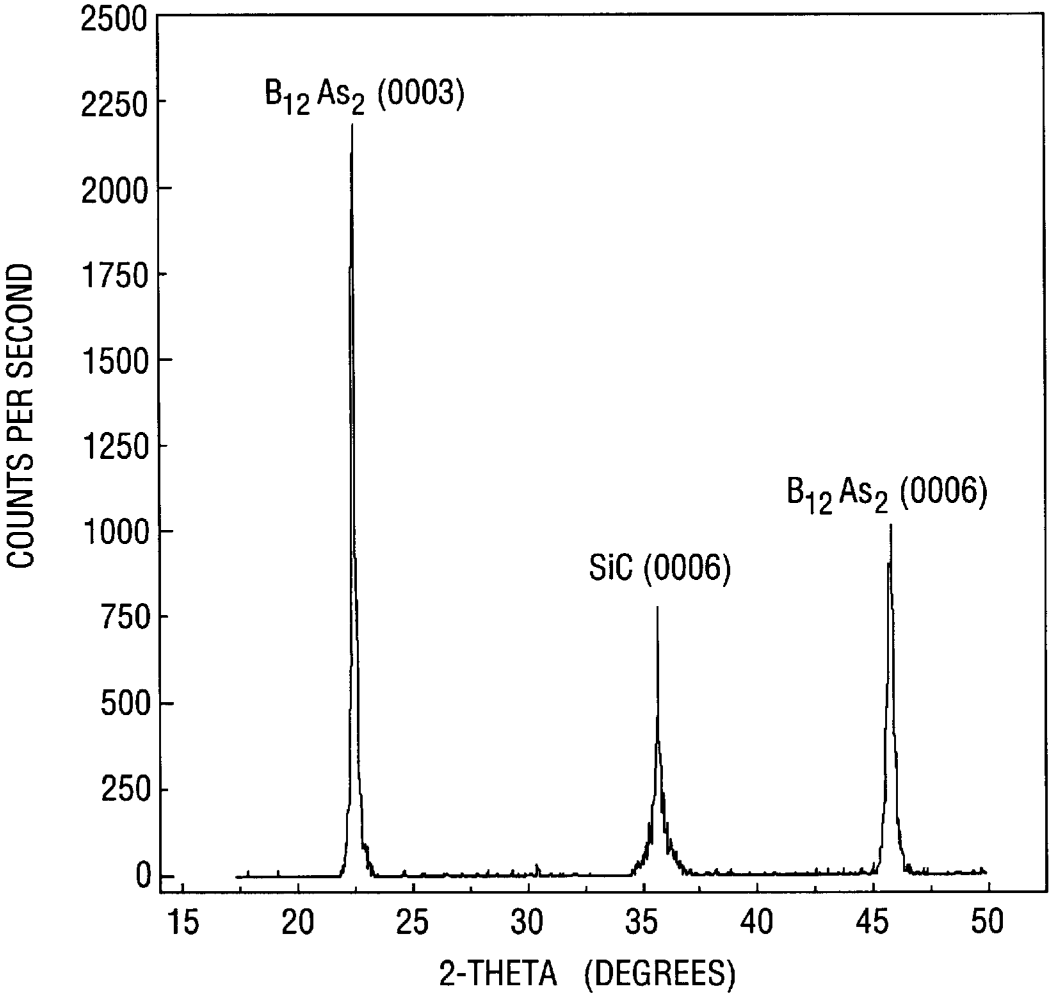
FIG. 4 is an x-ray diffraction pattern for a $B_{12}As_2$ thin film deposited on a <0001>6H-SiC substrate.

X-ray diffraction patterns were measured for the films grown on both the on-axis SiC and 3.5 degree off-axis SiC substrates. Similar spectra were obtained. FIG. 4 is a typical x-ray diffraction pattern obtained for these films. This pattern unambiguously confirms that the deposited films are comprised of $B_{12}As_2$.

Figure 5:
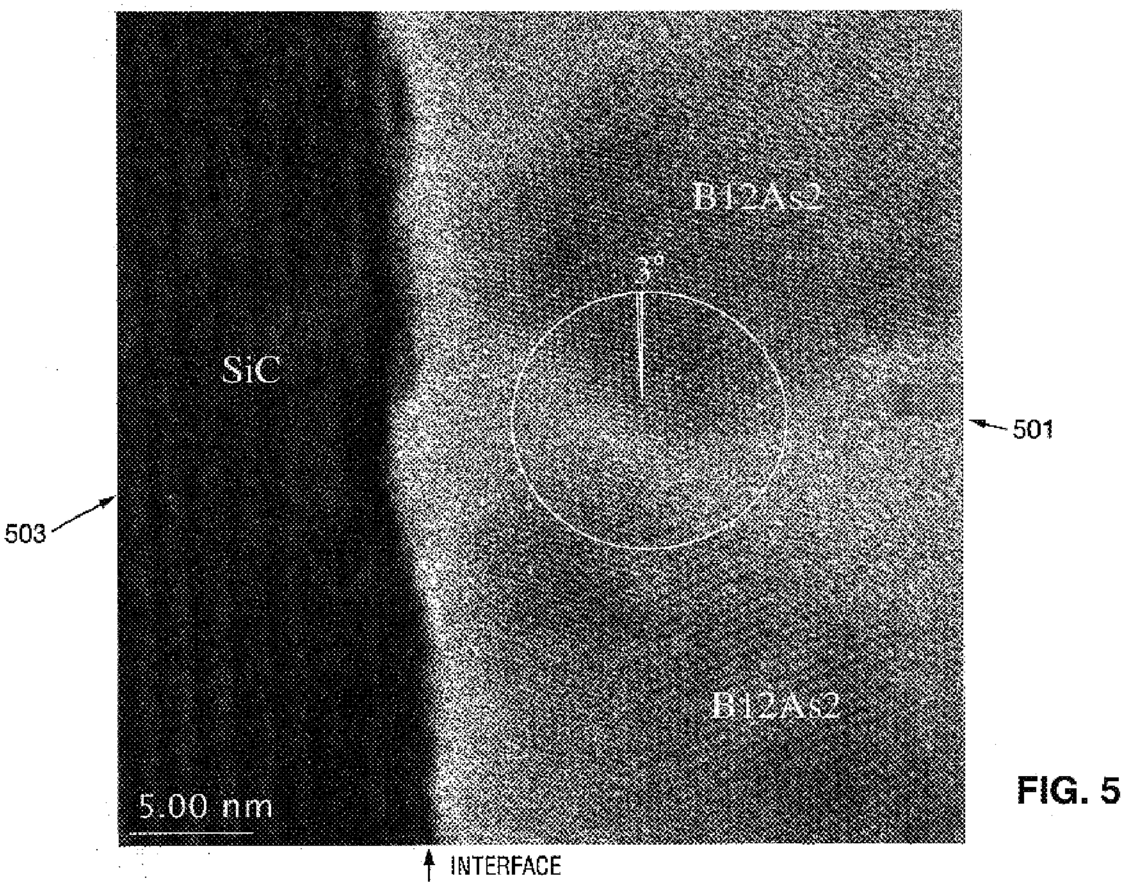
FIG. 5 is a high resolution TEM micrograph showing the interface between a $B_{12}As_2$ thin film and a SiC substrate.

FIG. 5 is a cross-sectional micrograph taken using transmission electron microscopy (i.e., TEM), the micrograph showing the interface between the $B_{12}As_2$ thin film 501 and the SiC substrate 503. As shown, $B_{12}As_2$ thin film 501 contains oriented, polycrystals of $B_{12}As_2$ with a mosaicity (i.e., a grain to grain misorientation) of up to 3 degrees.

Figure 6:
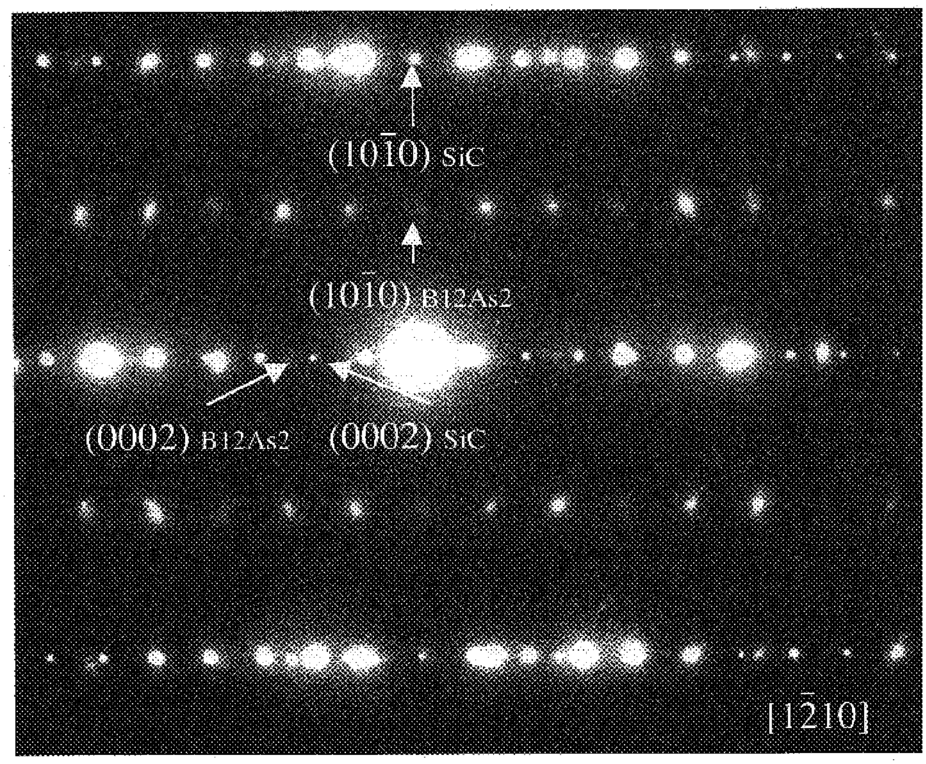
FIG. 6 is an electron diffraction pattern along the [1210] zone axis for a $B_{12}As_2$ film deposited on the "on-axis"<0001>6H—SiC substrate.

The lattice matching relationship between $B_{12}As_2$ and SiC can be expressed mathematically as $a_{B_{12}As_2}=2a_{SiC}$. This relationship is confirmed from the electron diffraction micrograph of FIG. 6 which shows the (10$\underline{1}$0) $B_{12}As_2$ reflections occurring exactly at the midpoint between the (10 $\underline{1}$0) SiC reflections.

As previously noted, $B_{12}As_2$ thin films grown on silicon substrates exhibited a high silicon background concentration. This silicon concentration has been attributed to the decomposition of the substrate during CVD growth. It is recognized that a high background impurity concentration can significantly degrade the optical and electrical properties of the icosahedral boride thin film. Careful analysis of the high resolution TEM image in FIG. 5 shows that the SiC lattice is regular and undisturbed to within one monolayer of the $B_{12}As_2$/SiC interface, thus indicating that the SiC substrate remained stable and did not decompose during the CVD process, resulting in a significantly less contaminated $B_{12}As_2$ epilayer.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A method for fabricating a semiconductor device, comprising the steps of:

providing a SiC substrate; and epitaxially growing an icosahedral boride layer on at least one surface of said SIC substrate.

2. The method of claim 1, further comprising the step of selecting $B_{12}P_2$ as said icosahedral bonds layer.

3. The method of claim 1, further comprising the step of selecting $B_{12}P_2$ as said icosahedral boride layer.

4. The method of claim 1, further comprising the step of orienting said SIC to less than 3.5 degrees off of <0001>, wherein said orienting step is performed prior to said epitaxially growing step.

5. The method of claim 1, further comprising the step of orienting said SiC to <0001>, wherein said orienting step is performed prior to said epitaxially growing step.

6. The method of claim 1, further comprising the step of selecting a deposition temperature of above 1050° C., said deposition temperature associated with said epitaxially growing step.

7. The method of claim 1, further comprising the step of selecting a deposition temperature within the range of 1100° C. to 1400° C., said deposition temperature associated with said epitaxially growing step.

8. The method of claim 1, further comprising the step of selecting a deposition temperature of approximately 1150° C., said deposition temperature associated with said epitaxially growing step.

9. The method of claim 1, wherein said step of epitaxially growing said icosahedral boride layer utilizes a chemical vapor deposition technique.

10. The method of claim 1, further comprising the steps of:

degreasing said SiC substrate; and drying said SiC in a flowing nitrogen gas environment, wherein said steps of degreasing and drying are performed prior to said epitaxially growing step.

11. A method for fabricating a semiconductor device, comprising the steps of:

providing a SiC substrate; and depositing an icosahedral boride layer on at least one surface of said SiC substrate.

12. The method of claim 11, further comprising the step of selecting $B_{12}P_2$ as said icosahedral boride layer.

13. The method of claim 11, further comprising the step of selecting $B_{12}As_2$ as said icosahedral boride layer.

14. The method of claim 11, further comprising the step of orienting said SiC to less than 3.5 degrees off of <0001>, wherein said orienting step is performed prior to said depositing step.

15. The method of claim 11, further comprising the step of orienting said SIC to <0001>, wherein said orienting step is performed prior to said depositing step.

16. The method of claim 11, further comprising the step of selecting a deposition temperature of above 1050° C., said deposition temperature associated with said depositing step.

17. The method of claim 11, further comprising the step of selecting a deposition temperature within the range of 1100° C. to 1400° C., said deposition temperature associated with said depositing step.

18. The method of claim 11, further comprising the step of selecting a deposition temperature of approximately 1500° C., said deposition temperature associated with said depositing step.

19. The method of claim 11, wherein said step of depositing said icosahedral boride layer utilizes a chemical vapor deposition technique.

20. The method of claim 11, further comprising the steps of:

degreasing said SIC substrate; and drying said SiC in a flowing nitrogen gas environment, wherein said steps of degreasing and drying are performed prior to said depositing step.

* * * * *